(12) United States Patent
Lee

(10) Patent No.: US 9,911,901 B2
(45) Date of Patent: Mar. 6, 2018

(54) LIGHT EMITTING DEVICE HAVING BUFFER LAYER WITH GRADED COMPOSITION

(71) Applicant: LG INNOTEK CO., LTD., Seoul (KR)

(72) Inventor: Ho Jun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/300,839

(22) PCT Filed: Mar. 3, 2015

(86) PCT No.: PCT/KR2015/002056
§ 371 (c)(1),
(2) Date: Sep. 30, 2016

(87) PCT Pub. No.: WO2015/156504
PCT Pub. Date: Oct. 15, 2015

(65) Prior Publication Data
US 2017/0125636 A1 May 4, 2017

(30) Foreign Application Priority Data
Apr. 7, 2014 (KR) .......... 10-2014-0041244

(51) Int. Cl.
*H01L 33/14* (2010.01)
*H01L 33/32* (2010.01)
(Continued)

(52) U.S. Cl.
CPC .......... *H01L 33/32* (2013.01); *H01L 21/0251* (2013.01); *H01L 21/0254* (2013.01);
(Continued)

(58) Field of Classification Search
CPC .... H01L 33/007–33/0075; H01L 33/14; H01L 33/25
See application file for complete search history.

(56) References Cited

U.S. PATENT DOCUMENTS

2003/0020087 A1* 1/2003 Goto ............... C30B 25/02
257/103
2010/0052010 A1 3/2010 Yoon
(Continued)

FOREIGN PATENT DOCUMENTS

EP 2 571 065 3/2013
EP 2 662 882 11/2013
(Continued)

OTHER PUBLICATIONS

International Search Report and Written Opinion dated Jul. 20, 2015 issued in Application No. PCT/KR2015/002056 (with English Translation).
(Continued)

*Primary Examiner* — Stephen Bradley
(74) *Attorney, Agent, or Firm* — KED & Associates, LLP

(57) ABSTRACT

A light-emitting device according to an embodiment comprises: a substrate; a first buffer layer disposed on the substrate; a second buffer layer disposed on the first buffer layer and containing Al; a first conductive type semiconductor layer disposed on the second buffer layer; an active layer disposed on the first conductive type semiconductor layer; and a second conductive type semiconductor layer disposed on the active layer, wherein the second buffer layer comprises a first layer and a second layer which are horizontally disposed, the first layer having an increased Al composition ratio as the first layer becomes closer to the first conductive type semiconductor layer, and the second layer having an decreased Al composition ratio as the second layer becomes closer to the first conductive type semiconductor layer. The embodiment configures the buffer layer by horizontally disposing the first layer of which the Al composition ratio linearly increases and the second layer of which the Al composition ratio linearly decreases, thereby having an effect of being capable of effectively controlling strain (Continued)

due to the lattice mismatch and the thermal expansion coefficient difference between the substrate and the first conductive type semiconductor layer.

17 Claims, 13 Drawing Sheets

(51) Int. Cl.
    *H01L 33/12*     (2010.01)
    *H01L 33/00*     (2010.01)
    *H01L 33/62*     (2010.01)
    *H01L 21/02*     (2006.01)
    *F21V 29/77*     (2015.01)
    *F21K 9/238*     (2016.01)
    *F21K 9/232*     (2016.01)
    *F21Y 115/10*     (2016.01)
    *F21K 9/235*     (2016.01)
    *F21K 9/237*     (2016.01)
    *F21V 3/02*     (2006.01)
    *F21V 3/04*     (2018.01)
    *F21V 7/22*     (2018.01)
    *F21V 8/00*     (2006.01)

(52) U.S. Cl.
    CPC ...... *H01L 21/02458* (2013.01); *H01L 33/007* (2013.01); *H01L 33/12* (2013.01); *H01L 33/62* (2013.01); *F21K 9/232* (2016.08); *F21K 9/235* (2016.08); *F21K 9/237* (2016.08); *F21K 9/238* (2016.08); *F21V 3/02* (2013.01); *F21V 3/0472* (2013.01); *F21V 7/22* (2013.01); *F21V 29/773* (2015.01); *F21V 29/777* (2015.01); *F21Y 2115/10* (2016.08); *G02B 6/0055* (2013.01); *G02B 6/0073* (2013.01); *G02B 6/0088* (2013.01); *H01L 21/0262* (2013.01); *H01L 2224/48091* (2013.01)

(56) References Cited

U.S. PATENT DOCUMENTS

| | | | |
|---|---|---|---|
| 2013/0089973 | A1 | 4/2013 | Komada |
| 2013/0126907 | A1 | 5/2013 | Kitano et al. |
| 2013/0307023 | A1 | 11/2013 | Kokawa et al. |
| 2015/0228857 | A1* | 8/2015 | Tsukihara ............ H01L 33/025 257/76 |

FOREIGN PATENT DOCUMENTS

| | | |
|---|---|---|
| JP | 2002-241198 | 8/2002 |
| JP | 2003-151910 | 5/2003 |
| JP | 2012-243871 | 12/2012 |
| JP | 2013-026321 | 2/2013 |
| JP | 2013-077638 | 4/2013 |
| JP | 2013-145821 | 7/2013 |
| KR | 10-2009-0069304 | 6/2009 |
| KR | 10-2012-0119480 | 10/2012 |

OTHER PUBLICATIONS

European Search Report dated Sep. 11, 2017 issued in Application No. 15777051.2.

* cited by examiner

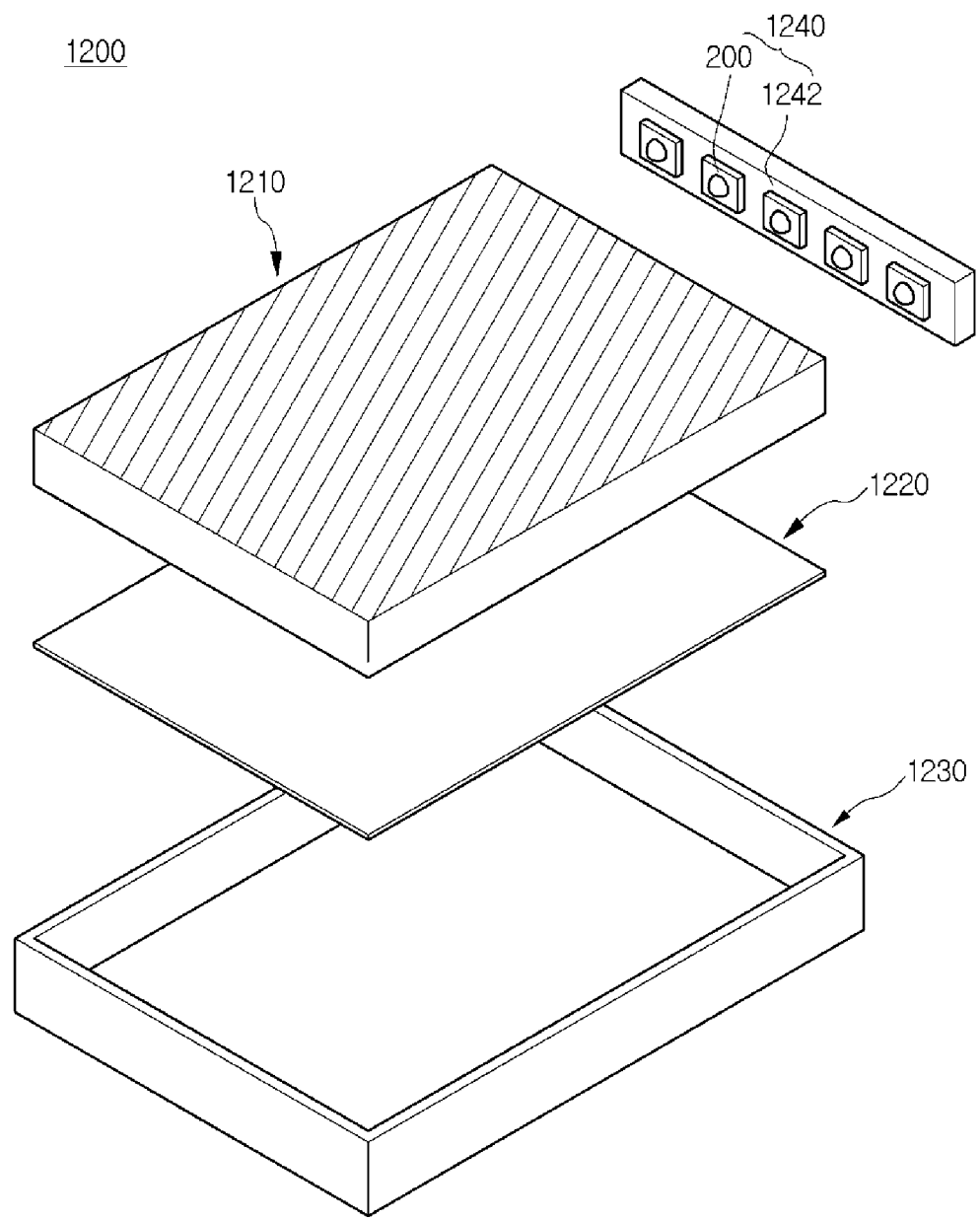

LIGHT EMITTING DEVICE HAVING BUFFER LAYER WITH GRADED COMPOSITION

CROSS-REFERENCE TO RELATED APPLICATIONS

This application is a U.S. National Stage Application under 35 U.S.C. § 371 of PCT Application No. PCT/KR2015/002056, filed on Mar. 3, 2015, which claims priority to Korean Patent Application No. 10-2014-0041244, filed on Apr. 7, 2014, whose entire disclosure are hereby incorporated by reference.

TECHNICAL FIELD

An embodiment relates to a light-emitting device for improving luminous efficiency.

BACKGROUND ART

Generally, a light-emitting device may be manufactured by using compound semiconductors of groups III and V in the periodic table as a compound semiconductor which converts electrical energy into light energy, and may implement various colors by adjusting a composition ratio of the compound semiconductors.

The light-emitting device emits energy corresponding to a band-gap energy between a conduction band and a valance band when electrons of an n-type layer and holes of a p-type layer recombine upon application of a forward voltage. This energy is usually emitted in the form of heat or light. The light-emitting device emits the energy in the form of light. For example, a nitride semiconductor has received much attention in development fields of optical devices and high-power electronic devices due to its high thermal stability and wide band-gap energy. In particular, a blue light-emitting device, a green light-emitting device, an ultraviolet (UV) light-emitting device, and the like using the nitride semiconductor have become commercialized and are widely used.

The nitride semiconductor according to the related art is formed by sequentially stacking a first conductive type semiconductor layer made of a GaN material and an active layer on a silicon substrate, and a second conductive type semiconductor layer. In order to prevent a strain from being generated due to a lattice mismatch and a thermal expansion coefficient difference between the silicon substrate and a GaN layer, a buffer layer is disposed between the silicon substrate and the first conductive type semiconductor layer.

Such a buffer layer has been mostly formed by growing AlGaN and has been formed by a method for increasing or decreasing an Al composition ratio from a surface of a substrate.

Strain control in a case where the Al composition ratio decreases from the surface of the substrate is more efficient than that in a case where the Al composition ratio increases from the surface of the substrate. However, in a case where the Al composition ratio decreases from the surface of the substrate, there is a limitation in that plastic deformation is caused by a strong compressive strain applied during the GaN growth.

DISCLOSURE OF THE INVENTION

Technical Problem

An embodiment provides a light-emitting device capable of improving luminous efficiency by effectively controlling a strain between a substrate and a GaN layer.

Technical Solution

A light-emitting device according to an embodiment includes: a substrate; a first buffer layer disposed on the substrate; a second buffer layer disposed on the first buffer layer and including Al; a first conductive type semiconductor layer disposed on the second buffer layer; an active layer disposed on the first conductive type semiconductor layer; and a second conductive type semiconductor layer disposed on the active layer, wherein the second buffer layer includes a first layer and a second layer which are horizontally disposed, and an Al composition ratio of the first layer increases toward the first conductive type semiconductor layer, and an Al composition ratio of the second layer decreases toward the first conductive type semiconductor layer.

Advantageous Effects

According to embodiments, a strain caused by a lattice mismatch and a thermal expansion coefficient difference between a substrate and a first conductive type semiconductor layer may be effectively controlled by horizontally disposing a first layer having a linearly increasing Al composition ratio and a second layers having a linearly decreasing Al composition ratio.

Furthermore, according to the embodiments, a very strong compressive strain may be applied to very effectively control a strain by forming a second layer so as to have a width greater than a width of a first layer.

BRIEF DESCRIPTION OF THE DRAWINGS

FIGS. 22 to 24 are exploded perspective views of embodiments of lighting systems respectively having light-emitting devices according to embodiments.

MODE FOR CARRYING OUT THE INVENTION

Hereinafter, embodiments will be described in detail with reference to the accompanying drawings.

Figure 1:
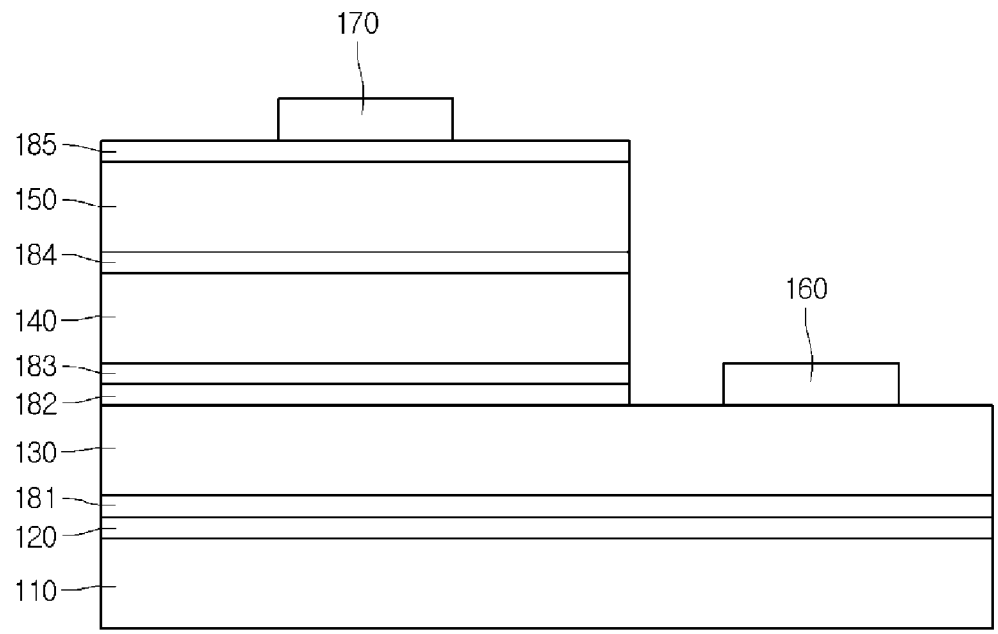
FIG. 1 is a cross-sectional view of a light-emitting device according to a first embodiment.
Figure 2:
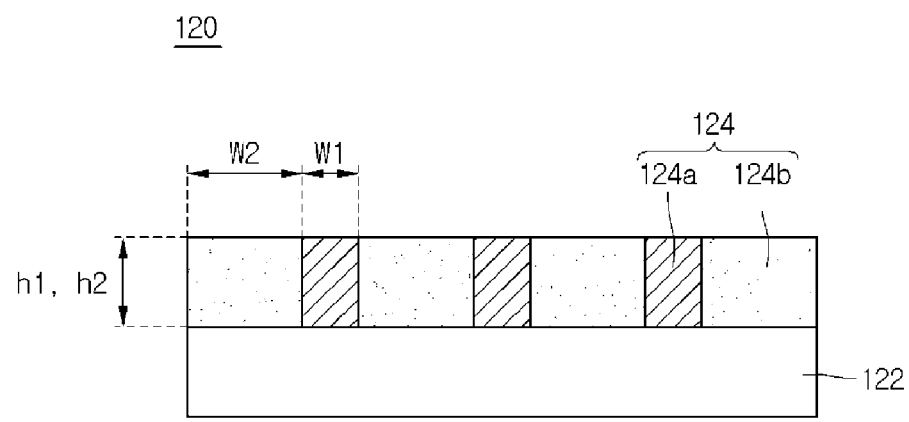
FIG. 2 is a cross-sectional view of a buffer layer in the light-emitting device according to the first embodiment.
Figure 3:
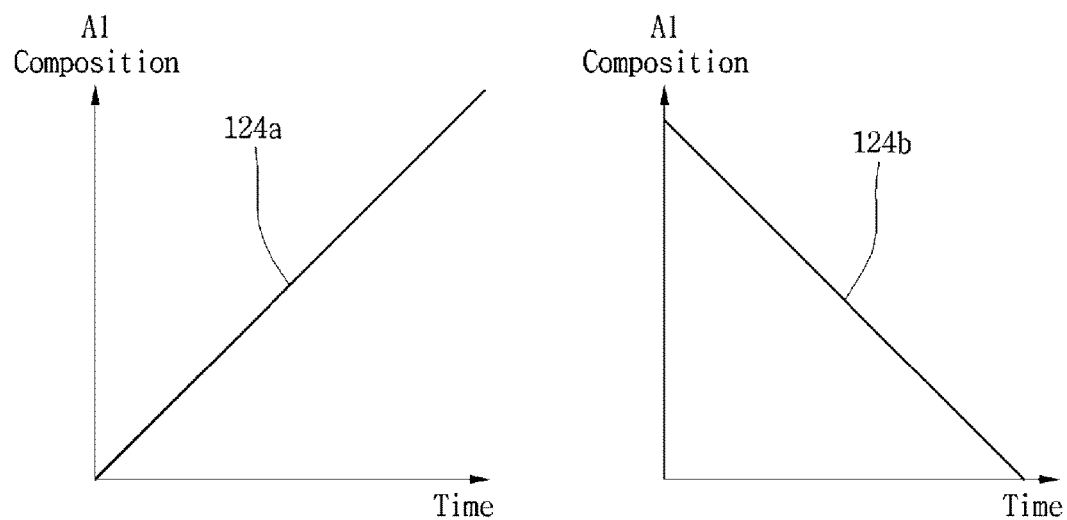
FIG. 3 is a graph of an Al composition ratio in the buffer layer according to the first embodiment.
Figure 4:
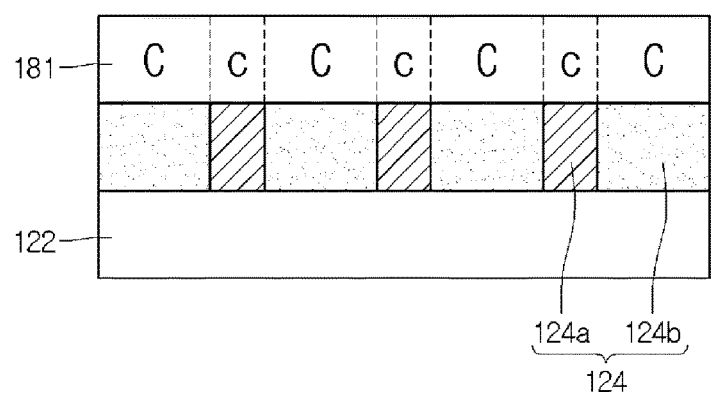
FIG. 4 is a cross-sectional view of a buffer layer and a u-GaN layer in the light-emitting device according to the first embodiment.

FIG. 1 is a cross-sectional view of a light-emitting device according to a first embodiment, FIG. 2 is a cross-sectional view of a buffer layer in the light-emitting device according to the first embodiment, FIG. 3 is a graph of an Al composition ratio in the buffer layer according to the first embodiment, and FIG. 4 is a cross-sectional view of the buffer layer a u-GaN layer in the light-emitting device according to the first embodiment.

Referring to FIG. 1, the light-emitting device according to the first embodiment includes: a substrate 110; a buffer layer 120 disposed on the substrate 110; a u-GaN layer 181 disposed on the buffer layer 120; a first conductive type semiconductor layer 130 disposed on the u-GaN layer 181; a current diffusion layer 182 disposed on the first conductive type semiconductor layer 130; a strain control layer 183 disposed on the current diffusion layer 182; an active layer 140 disposed on the strain control layer 183; an electron blocking layer 184 disposed on the active layer 140; a second conductive type semiconductor layer 150 disposed on the electron blocking layer 184; a transparent electrode layer 185 disposed on the second conductive type semiconductor layer 150; a first electrode 160 disposed on the first conductive type semiconductor layer 130; and a second electrode 170 disposed on the transparent electrode layer 185.

The substrate 110 may be made of a material having excellent thermal conductivity and may be a conductive substrate or an insulating substrate. For example, the substrate 110 may use at least one selected from sapphire (Al2O3), SiC, Si, GaAs, GaN, ZnO, GaP, InP, Ge, and Ga2O3.

The buffer layer 120 may be disposed on the substrate 110.

The buffer layer 120 functions to reduce a lattice mismatch between a material of the light-emitting structure and the substrate 110. The buffer layer 120 may include a group III-V compound semiconductor. The buffer layer 120 may be made of a material including Al. The buffer layer 120 may be made of at least one selected from AlN, AlGaN, InAlGaN, and AlInN. The buffer layer 120 will be described in detail later with reference to the accompanying drawings.

The u-GaN (undoped GaN) layer 181 may be disposed on the buffer layer 120. The u-GaN layer 181 may function to improve film quality.

The first conductive type semiconductor layer 130 may be disposed on the u-GaN layer 181.

The first conductive type semiconductor layer 130 may include, for example, an n-type semiconductor layer. The first conductive type semiconductor layer 130 may be implemented by using a compound semiconductor. The first conductive type semiconductor layer 130 may be implemented by using, for example, a group II-VI compound semiconductor or a group III-V compound semiconductor.

The first conductive type semiconductor layer 130 may be implemented by using a semiconductor material having an empirical formula of $In_xAl_yGa_{1-x-y}N$ ($0 \leq x \leq 1$, $0 \leq y \leq 1$, $0 \leq x+y \leq 1$). The first conductive type semiconductor layer 130 may be selected from, for example, GaN, AlN, AlGaN, InGaN, InN, InAlGaN, AlInN, AlGaAs, GaP, GaAs, GaAsP, AlGaInP, and the like, and may be doped with an n-type dopant such as Si, Ge, Sn, Se, or Te.

The current diffusion layer 182 may increase luminous efficiency by improving internal quantum efficiency, and may be an undoped gallium nitride (GaN) layer. An electron injection layer (not illustrated) may be further formed on the current diffusion layer 182. The electron injection layer may be a gallium nitride layer. For example, since an n-type doping element is doped to a concentration of about $6.0 \times 10^{18}$ atoms/cm3 to about $3.0 \times 10^{19}$ atoms/cm3 in the electron injection layer, electrons may be efficiently injected.

The strain control layer 183 may be formed on the current diffusion layer 182.

The strain control layer 183 functions to efficiently reduce a stress caused by a lattice mismatch between the first conductive type semiconductor layer 130 and the active layer 140.

A lattice constant of the strain control layer 183 may be greater than a lattice constant of the first conductive type semiconductor layer 130 and less than a lattice constant of the active layer 140. Therefore, the strain control layer 183 may minimize a stress caused by a lattice constant difference between the active layer 140 and the first conductive type semiconductor layer 130.

The active layer 140 may be disposed on the strain control layer 183.

The active layer 140 is a layer which emits light due to a band-gap difference of an energy band according to a material for forming the active layer 140 when electrons (or holes) injected through the first conductive type semiconductor layer 130 and holes (or electrons) injected through the second conductive type semiconductor layer 150 are recombined with each other. The active layer 140 may be formed to have a single well structure, a multi-well structure, a single quantum dot structure, or a quantum-wire structure, but the embodiment is not limited thereto.

The active layer 140 may be implemented by using a compound semiconductor. The active layer 140 may be implemented by using, for example, a group II-VI compound semiconductor or a group III-V compound semiconductor. The active layer 140 may be implemented by using, for example, a semiconductor material having an empirical formula of $In_xAl_yGa_{1-x-y}N$ ($0 \leq x \leq 1$, $0 \leq y \leq 1$, $0 \leq x+y \leq 1$). When the active layer 140 is implemented to have the multi-well structure, the active layer 140 may be implemented by stacking a plurality of well layers and a plurality of barrier layers. For example, the active layer 140 may be implemented to have a cycle of InGaN well layer/GaN barrier layer.

The electron blocking layer (EBL) 184 may be disposed on the active layer 140.

The electron blocking layer 184 may function as electron blocking and MQW cladding of an active layer, and thus, may improve luminous efficiency. The electron blocking layer 184 may be made of an $Al_xIn_yGa_{(1-x-y)}N$ ($0 \leq x \leq 1$, $0 \leq y \leq 1$)-based semiconductor, may have an energy band gap less than an energy band gap of the active layer 140, and may be formed to have a thickness of about 100 Å to about 600 Å, but the embodiment is not limited thereto. Alternatively, the electron blocking layer 184 may be formed to have an AlzGa(1-z)N/GaN (0≤z≤1) superlattice.

The second conductive type semiconductor layer 150 may be disposed on the electron blocking layer 184.

The second conductive type semiconductor layer 150 may be implemented as, for example, a p-type semiconductor layer. The second conductive type semiconductor layer 150 may be implemented by using a compound semiconductor. The second conductive type semiconductor layer 150 may be implemented by using, for example, a group II-VI compound semiconductor or a group III-V compound semiconductor.

The second conductive type semiconductor layer 150 may be implemented by using a semiconductor material having an empirical formula of InxAlyGa1-x-yN (0≤x≤1, 0≤y≤1, 0≤x+y≤1). The second conductive type semiconductor layer 150 may be selected from, for example, GaN, AlN, AlGaN, InGaN, InN, InAlGaN, AlInN, AlGaAs, GaP, GaAs, GaAsP, AlGaInP, and the like, and may be doped with a p-type dopant such as Mg, Zn, Ca, Sr, or Ba.

The first conductive type semiconductor layer 130 may include a p-type semiconductor layer, and the second conductive type semiconductor layer 150 may include an n-type semiconductor layer. In addition, a semiconductor layer including an n-type or p-type semiconductor layer may be further formed below the second conductive type semiconductor layer 150. The light-emitting structure may have any one of an np junction structure, a pn junction structure, an npn junction structure, and a pnp junction structure.

A doping concentration of impurities may be uniform or ununiform inside the first conductive type semiconductor layer 130 and the second conductive type semiconductor layer 150. That is, the light-emitting structure may be formed to have various structures, and the embodiment is not limited thereto.

The transparent electrode layer 185 may be disposed on the second conductive type semiconductor layer 150.

The transparent electrode layer 185 may be formed by multi-stacking a single metal, a metal alloy, and/or a metal oxide so that carriers are efficiently injected. For example, the transparent electrode layer 185 may be made of a material having an excellent contact with a semiconductor. The transparent electrode layer 185 may include at least one selected from indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but is not limited thereto.

The second electrode 170 is formed on the transparent electrode layer 185, and the first electrode 160 is formed on a partially exposed upper portion of the first conductive type semiconductor layer 130. The first electrode 160 and the second electrode 170 may be made of a metal or an alloy, which includes, for example, any one of Cr, Ti, Ag, Ni, RH, Pd, Ir, Ru, Mg, Zn, Pt, Cu, Au, and Hf. After that, the manufacturing of the light-emitting device may be finally completed by connecting the first electrode 160 and the second electrode 170 to each other.

Meanwhile, as illustrated in FIG. 2, the buffer layer 120 according to the first embodiment may include a first buffer layer 122 and a second buffer layer 124.

The first buffer layer 122 may include AlN. The first buffer layer 122 is illustrated as being formed as one layer, but may be formed as two or more layers. The second buffer layer 124 may be disposed on the first buffer layer 122. A height h2 of the second buffer layer 124 may be equal to a height h1 of the first buffer layer 122.

The second buffer layer 124 may include AlGaN. The second buffer layer 124 may be disposed so as to contact the u-GaN layer 181. The second buffer layer 124 may include a first layer 124a and a second layer 124b. The first layer 124a and the second layer 124b may be horizontally disposed in plurality. The plurality of first layers 124a and the plurality of second layers 124b may be horizontally and alternately disposed. The plurality of first layers 124a and the plurality of second layers 124b may be radially and alternately disposed. The second layer 124b may be disposed at an outermost portion of the second buffer layer 124. Since the second layer 124b is disposed at the outermost portion of the second buffer layer 124, more second layers 124b may be formed on the second buffer layer 124.

A width W2 of the second layer 124b is greater than a width W1 of the first layer 124a. A height h1 of the first layer 124a may be equal to a height h2 of the second layer 124b. The plurality of first layer 124a may be formed to have the equal width or different widths. The plurality of second layers 124b may be formed to have the equal width or different widths.

As illustrated in FIG. 3, the first layer 124a may include AlxGa1-xN (0≤X≤1). An Al composition ratio of the first layer 124a may linearly increase toward the first conductive type semiconductor layer 130. The Al composition ratio may be about 100% at a portion of the first layer 124a which is adjacent to the first conductive type semiconductor layer 130. The Al composition ratio of the first layer 124a may linearly decrease toward the substrate 110. The Al composition ratio may be about 0% at a portion of the first layer 124a which is adjacent to the substrate 110.

The second layer 124b may include AlxGa1-xN (0≤X≤1). An Al composition ratio of the second layer 124b may linearly decrease toward the first conductive type semiconductor layer 130. The Al composition ratio may be about 0% at a portion of the second layer 124b which is adjacent to the first conductive type semiconductor layer 130. The Al composition ratio of the second layer 124b may linearly increase toward the substrate 110. The Al composition ratio may be about 100% at a portion of the second layer 124b which is adjacent to the substrate 110.

As described above, the buffer layer 120 may effectively control a strain caused by physical properties (i.e., a lattice mismatch and a thermal expansion coefficient difference) between the substrate 110 and the first conductive type semiconductor layer 130 by horizontally disposing the first layer 124a of which the Al composition ratio linearly increases toward the first conductive type semiconductor layer 130, and the second layer 124b of which the Al composition ratio linearly decreases toward the first conductive type semiconductor layer 130.

As illustrated in FIG. 4, when a width of the second layer 124b is greater than a width of the first layer 124a, a very strong compressive strain is applied to the u-GaN layer 181. Accordingly, it is very effective in controlling a strain. That is, since a compressive strain is more strongly applied to the u-GaN layer 181 compared to when the width of the first layer 124a is equal to the width of the second layer 124b, it is very effective in controlling the strain. Furthermore, since the first layer 124a is disposed between the second layers 124b, a lattice mismatch may be reduced to prevent a dislocation from being generated.

Figure 5:
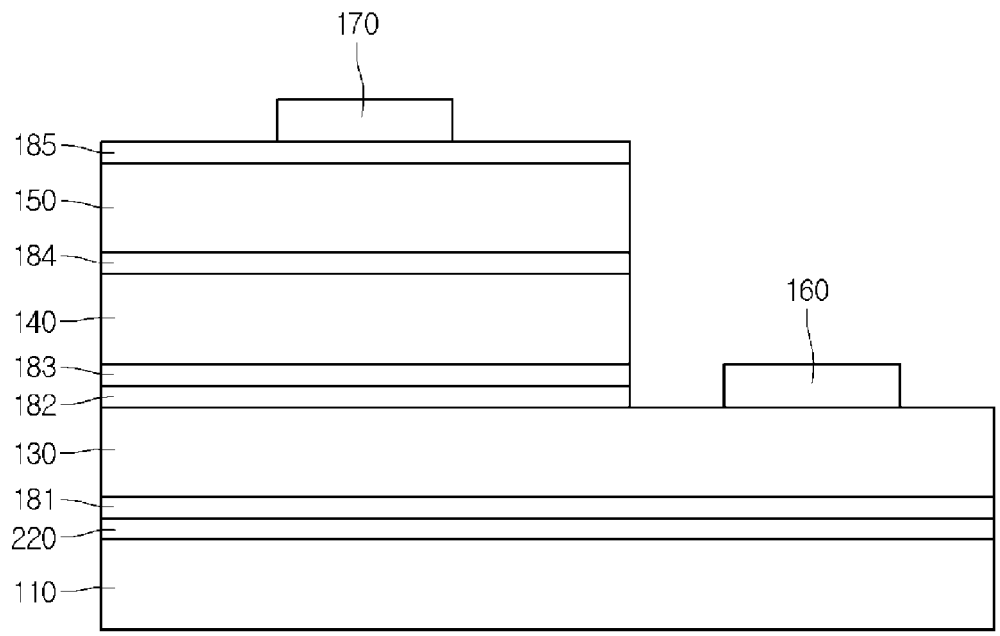
FIG. 5 is a cross-sectional view of a light-emitting device according to a second embodiment.
Figure 6:
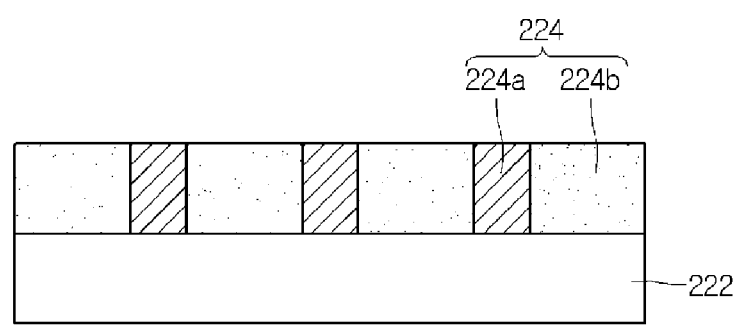
FIG. 6 is a cross-sectional view of a buffer layer in the light-emitting device according to the second embodiment.
Figure 7:
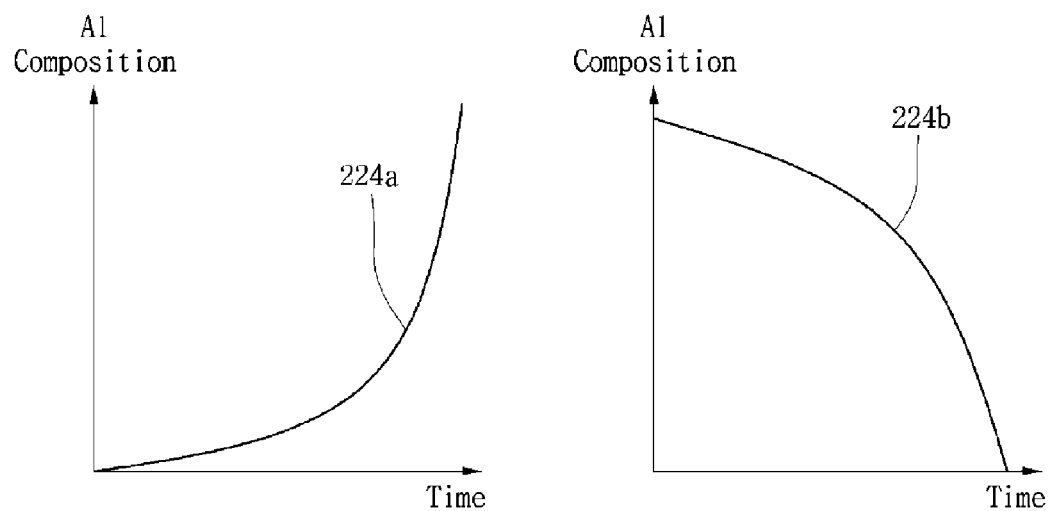
FIG. 7 is a graph of an Al composition ratio in the buffer layer according to the second embodiment.

FIG. 5 is a cross-sectional view of a light-emitting device according to a second embodiment, FIG. 6 is a cross-sectional view of a buffer layer in the light-emitting device according to the second embodiment, and FIG. 7 is a graph of an Al composition ratio in the buffer layer according to the second embodiment.

Referring to FIG. 5, the light-emitting device according to the second embodiment includes: a substrate 110; a buffer layer 220 disposed on the substrate 110; a u-GaN layer 181 disposed on the buffer layer 220; a first conductive type semiconductor layer 130 disposed on the u-GaN layer 181; a current diffusion layer 182 disposed on the first conductive type semiconductor layer 130; a strain control layer 183 disposed on the current diffusion layer 182; an active layer 140 disposed on the strain control layer 183; an electron blocking layer 184 disposed on the active layer 140; a second conductive type semiconductor layer 150 disposed on the electron blocking layer 184; a transparent electrode layer 185 disposed on the second conductive type semiconductor layer 150; a first electrode 160 disposed on the first conductive type semiconductor layer 130; and a second electrode 170 disposed on the transparent electrode layer 185. Here, since elements except for the buffer layer are the same as elements of the light-emitting device according to the first embodiment, redundant descriptions thereof will be omitted.

As illustrated in FIG. 6, the buffer layer 220 according to the second embodiment may include a first buffer layer 222 and a second buffer layer 224.

The first buffer layer 222 may include AlN. The second buffer layer 224 may be disposed on the first buffer layer 222. The second buffer layer 224 may include AlGaN.

The second buffer layer 224 may include one or more first layers 224a and one or more second layers 224b. The first layers 224a and the second layers 224b may be horizontally and alternately disposed. The first layers 224a and the second layers 224b may be radially and alternately disposed. The second layer 224b may be disposed at an outermost portion of the second buffer layer 224. A width of the second layer 224b is greater than a width of the first layer 224a. A height of the first layer 224a may be equal to a height of the second layer 224b.

As illustrated in FIG. 7, the first layer 224a may include AlxGa1-xN ($0 \leq X \leq 1$).) An Al composition ratio of the first layer 224a may nonlinearly increase toward the first conductive type semiconductor layer 130. The Al composition ratio of the first layer 224a may nonlinearly increase toward the first conductive type semiconductor layer 130 in a downward convex form. The Al composition ratio may be about 100% at a portion of the first layer 224a which is adjacent to the first conductive type semiconductor layer 130. The Al composition ratio may be about 0% at a portion of the first layer 224a which is adjacent to the substrate 110.

The second layer 124b may include AlxGa1-xN ($0 \leq X \leq 1$). An Al composition ratio of the second layer 124b may nonlinearly decrease toward the first conductive type semiconductor layer 130. The Al composition ratio of the second layer 124b may nonlinearly decrease toward the first conductive type semiconductor layer 130 in an upward convex form. The Al composition ratio may be about 0% at a portion of the second layer 224b which is adjacent to the first conductive type semiconductor layer 130. The Al composition ratio may be about 100% at a portion of the second layer 224b which is adjacent to the substrate 110.

As described above, the buffer layer 220 may effectively control a strain caused by physical properties (i.e., a lattice mismatch and a thermal expansion coefficient difference) between the substrate 110 and the first conductive type semiconductor layer 130 by horizontally disposing the first layers 224a of which the Al composition ratio nonlinearly increases toward the first conductive type semiconductor layer 130, and the second layers 224b of which the Al composition ratio nonlinearly decreases toward the first conductive type semiconductor layer 130.

Figure 8:
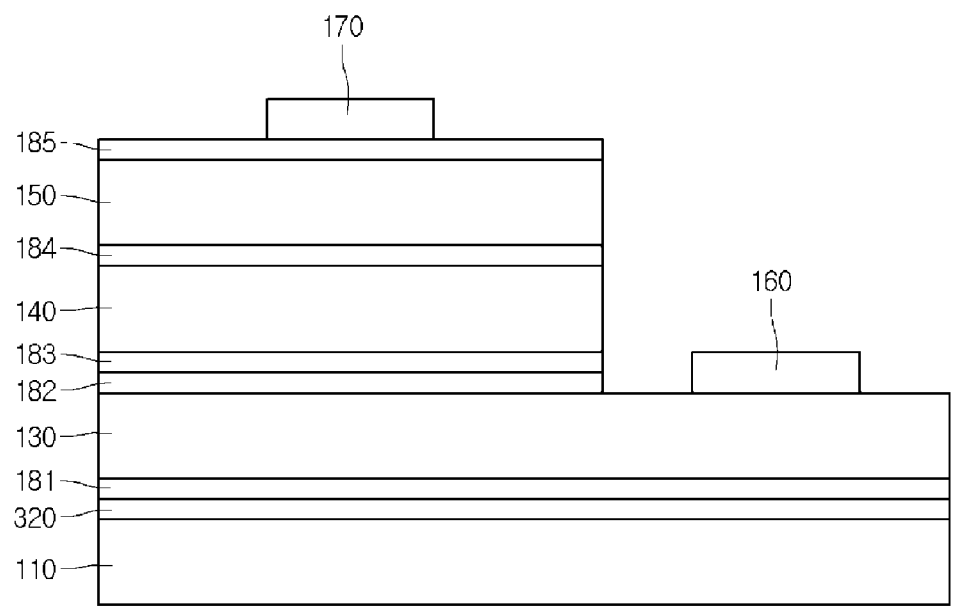
FIG. 8 is a cross-sectional view of a light-emitting device according to a third embodiment.
Figure 9:
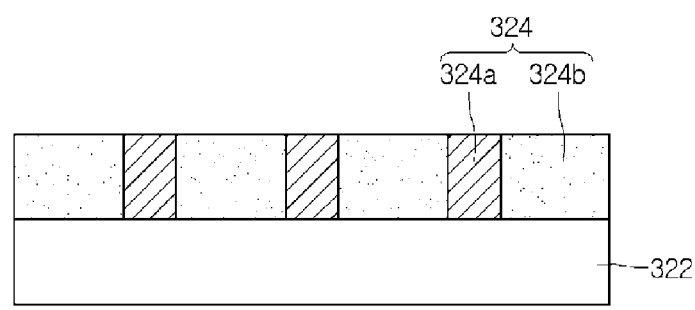
FIG. 9 is a cross-sectional view of a buffer layer in the light-emitting device according to the third embodiment.
Figure 10:
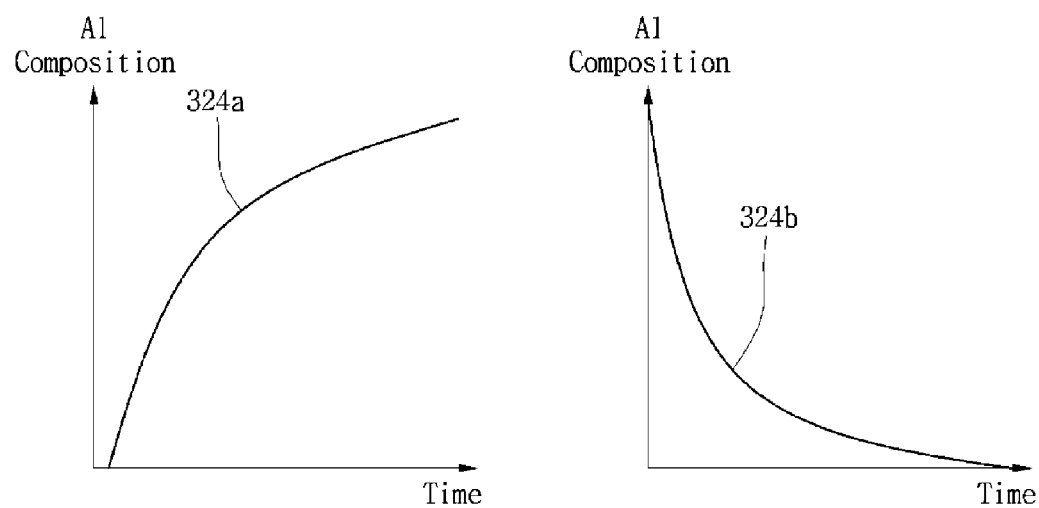
FIG. 10 is a graph of an Al composition ratio in the buffer layer according to the third embodiment.

FIG. 8 is a cross-sectional view of a light-emitting device according to a third embodiment, FIG. 9 is a cross-sectional view of a buffer layer in the light-emitting device according to the third embodiment, and FIG. 10 is a graph of an Al composition ratio in the buffer layer according to the third embodiment.

Referring to FIG. 8, the light-emitting device according to the third embodiment includes: a substrate 110; a buffer layer 320 disposed on the substrate 110; a u-GaN layer 181 disposed on the buffer layer 320; a first conductive type semiconductor layer 130 disposed on the u-GaN layer 181; a current diffusion layer 182 disposed on the first conductive type semiconductor layer 130; a strain control layer 183 disposed on the current diffusion layer 182; an active layer 140 disposed on the strain control layer 183; an electron blocking layer 184 disposed on the active layer 140; a second conductive type semiconductor layer 150 disposed on the electron blocking layer 184; a transparent electrode layer 185 disposed on the second conductive type semiconductor layer 150; a first electrode 160 disposed on the first conductive type semiconductor layer 130; and a second electrode 170 disposed on the transparent electrode layer 185. Here, since elements except for the buffer layer are the same as elements of the light-emitting device according to the first embodiment, redundant descriptions thereof will be omitted.

As illustrated in FIG. 9, the buffer layer 320 according to the third embodiment may include a first buffer layer 322 and a second buffer layer 324.

The first buffer layer 322 may include AlN. The second buffer layer 324 may be disposed on the first buffer layer 322. The second buffer layer 324 may include AlGaN.

The second buffer layer 324 may include one or more first layers 324a and one or more second layers 324b. The first layers 324a and the second layers 324b may be horizontally and alternately disposed. The first layers 324a and the second layers 324b may be radially and alternately disposed. The second layer 324b may be disposed at an outermost portion of the second buffer layer 324. A width of the second layer 324b is greater than a width of the first layer 324a. A height of the first layer 324a may be equal to a height of the second layer 324b.

As illustrated in FIG. 10, the first layer 324a may include AlxGa1-xN ($0 \leq X \leq 1$). An Al composition ratio of the first layer 324a may nonlinearly increase toward the first conductive type semiconductor layer 130. The Al composition ratio of the first layer 324a may nonlinearly increase toward the first conductive type semiconductor layer 130 in an upward convex form. The Al composition ratio may be about 100% at a portion of the first layer 324a which is adjacent to the first conductive type semiconductor layer 130. The Al composition ratio may be about 0% at a portion of the first layer 324a which is adjacent to the substrate 110.

The second layers 324b may include AlxGa1-xN ($0 \leq X \leq 1$). An Al composition ratio of the second layer 324b may nonlinearly decrease toward the first conductive type semiconductor layer 130. The Al composition ratio of the second layers 324b may nonlinearly decrease toward the first conductive type semiconductor layer 130 in a downward convex form. The Al composition ratio may be about 0% at a portion of the second layer 324b which is adjacent to the first conductive type semiconductor layer 130. The Al composition ratio may be about 100% at a portion of the second layer 324b which is adjacent to the substrate 110.

As described above, the buffer layer 320 may effectively control a strain caused by physical properties (i.e., a lattice mismatch and a thermal expansion coefficient difference) between the substrate 110 and the first conductive type semiconductor layer 130 by horizontally disposing the first layer 324a of which the Al composition ratio nonlinearly increases toward the first conductive type semiconductor layer 130, and the second layers 324b of which the Al composition ratio nonlinearly decreases toward the first conductive type semiconductor layer 130.

Figure 11:
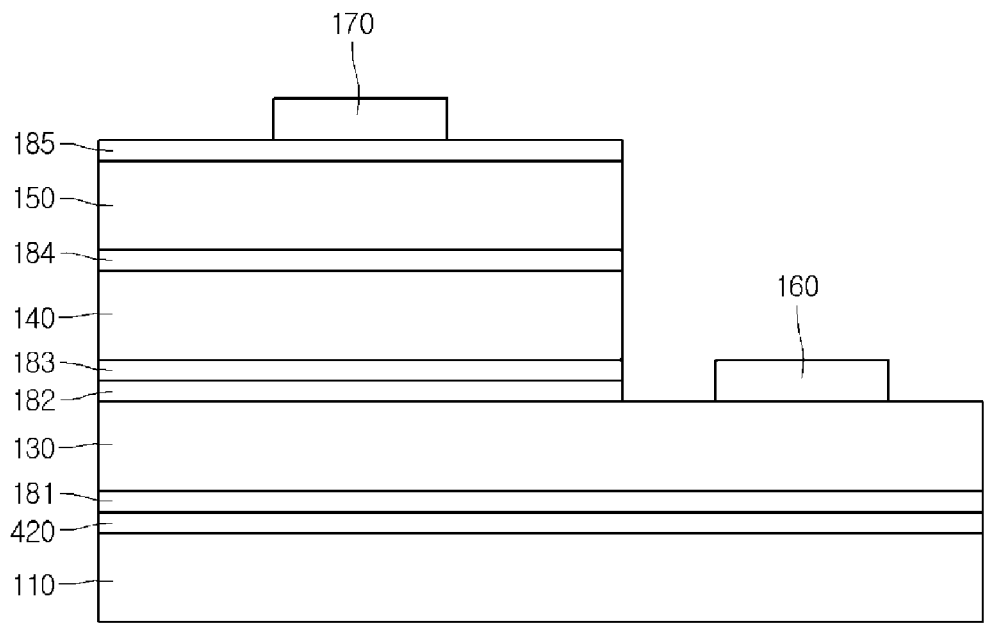
FIG. 11 is a cross-sectional view of a light-emitting device according to a fourth embodiment.
Figure 12:
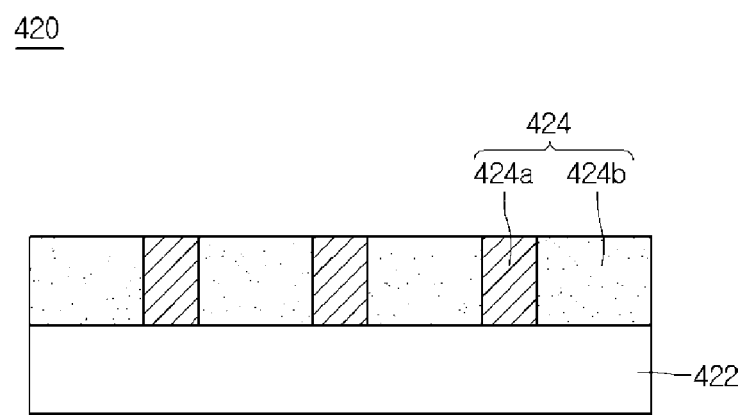
FIG. 12 is a cross-sectional view of a buffer layer in the light-emitting device according to the fourth embodiment.
Figure 13:
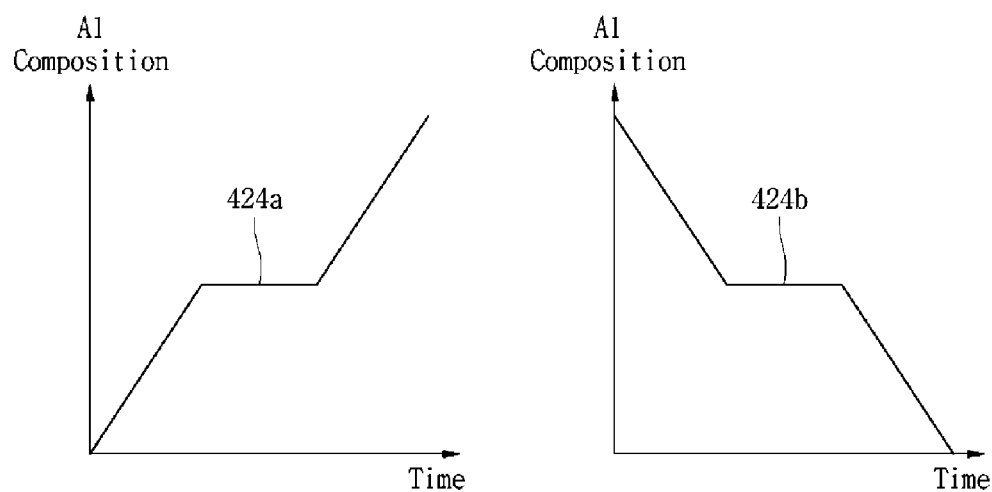
FIG. 13 is a graph of an Al composition ratio in the buffer layer according to the fourth embodiment.

FIG. 11 is a cross-sectional view of a light-emitting device according to a fourth embodiment, FIG. 12 is a cross-sectional view of a buffer layer in the light-emitting device according to the fourth embodiment, and FIG. 13 is a graph of an Al composition ratio in the buffer layer according to the fourth embodiment.

Referring to FIG. 11, the light-emitting device according to the fourth embodiment includes: a substrate 110; a buffer layer 420 disposed on the substrate 110; a u-GaN layer 181 disposed on the buffer layer 420; a first conductive type semiconductor layer 130 disposed on the u-GaN layer 181; a current diffusion layer 182 disposed on the first conductive type semiconductor layer 130; a strain control layer 183 disposed on the current diffusion layer 182; an active layer 140 disposed on the strain control layer 183; an electron blocking layer 184 disposed on the active layer 140; a second conductive type semiconductor layer 150 disposed on the electron blocking layer 184; a transparent electrode layer 185 disposed on the second conductive type semiconductor layer 150; a first electrode 160 disposed on the first conductive type semiconductor layer 130; and a second electrode 170 disposed on the transparent electrode layer 185. Here, since elements except for the buffer layer are the same as elements of the light-emitting device according to the first embodiment, redundant descriptions thereof will be omitted.

As illustrated in FIG. 12, the buffer layer 420 according to the fourth embodiment may include a first buffer layer 422 and a second buffer layer 424.

The first buffer layer 422 may include AlN. The second buffer layer 424 may be disposed on the first buffer layer 422. The second buffer layer 424 may include AlGaN.

The second buffer layer 424 may include one or more first layers 424a and one or more second layers 424b. The first layers 424a and the second layers 424b may be horizontally and alternately disposed. The first layers 424a and the second layers 424b may be radially and alternately disposed. The second layer 424b may be disposed at an outermost portion of the second buffer layer 424. A width of the second layer 424b is greater than a width of the first layer 424a. A height of the first layer 424a may be equal to a height of the second layer 424b.

As illustrated in FIG. 13, the first layer 424a may include $Al_xGa_{1-x}N$ ($0 \le X \le 1$).) An Al composition ratio of the first layer 424a may increase toward the first conductive type semiconductor layer 130 in a stepped form. The Al composition ratio may be about 100% at a portion of the first layer 424a which is adjacent to the first conductive type semiconductor layer 130. The Al composition ratio may be about 0% at a portion of the first layer 424a which is adjacent to the substrate 110.

The second layer 424b may include $Al_xGa_{1-x}N$ ($0 \le X \le 1$). An Al composition ratio of the second layer 124b may decrease toward the first conductive type semiconductor layer 130 in a stepped form. The Al composition ratio may be about 0% at a portion of the second layer 424b which is adjacent to the first conductive type semiconductor layer 130. The Al composition ratio may be about 100% at a portion of the second layer 424b which is adjacent to the substrate 110.

As described above, the buffer layer 420 may effectively control a strain caused by physical properties (i.e., a lattice mismatch and a thermal expansion coefficient difference) between the substrate 110 and the first conductive type semiconductor layer 130 by horizontally disposing the first layer 424a of which the Al composition ratio increases toward the first conductive type semiconductor layer 130 in the stepped form, and the second layers 424b of which the Al composition ratio decreases toward the first conductive type semiconductor layer 130 in the stepped form.

Figure 14:
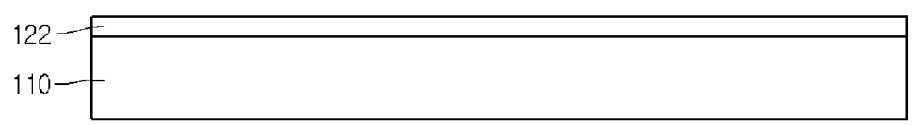
FIGS. 14 and 20 are cross-sectional views of a method for manufacturing a light-emitting device according to a first embodiment.
Figure 20:
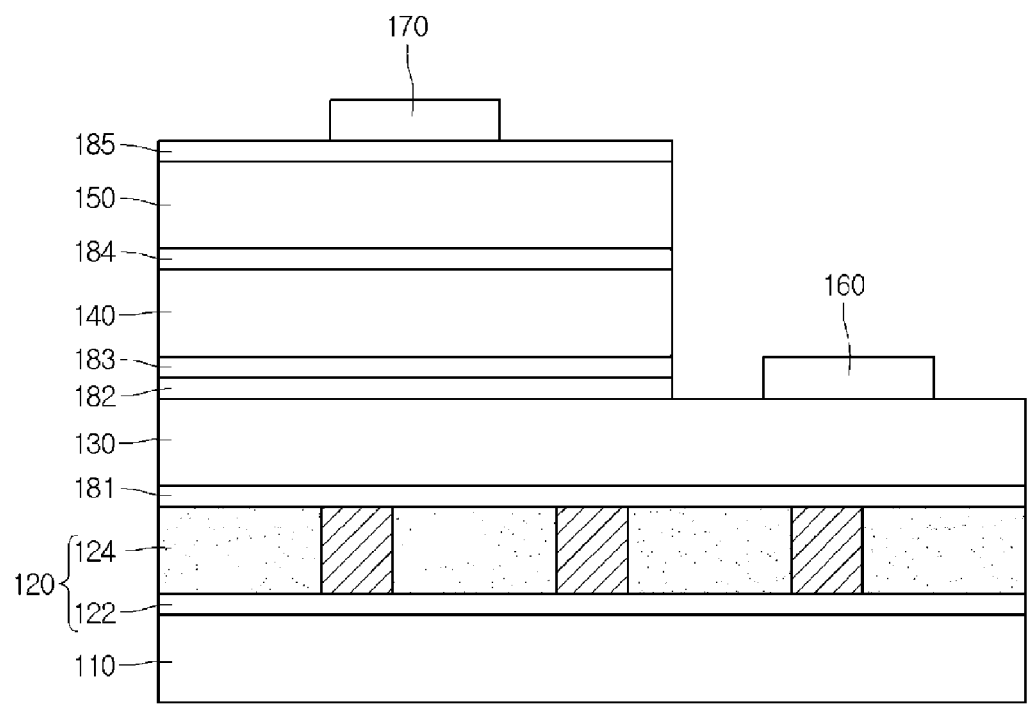

Hereinafter, a method for manufacturing a light-emitting device according to a first embodiment will be described. FIGS. 14 and 20 are cross-sectional views of the method for manufacturing the light-emitting device according to the first embodiment.

As illustrated in FIG. 14, when a substrate 110 is prepared, a first buffer layer 122 is formed on one surface of the substrate 110. The first buffer layer 122 may be formed by depositing AlN on the substrate 110 to a certain thickness through a metal organic chemical vapor deposition (MOCVD). The first buffer layer 122 may be formed though a chemical vapor deposition (CVD), a molecular beam epitaxy (MBE), or sputtering, in addition to the MOCVD.

Figure 15:
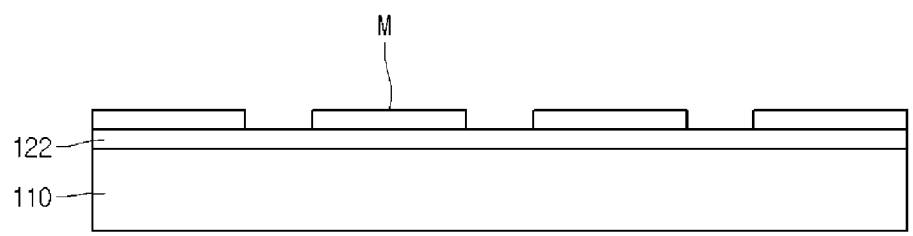

As illustrated in FIG. 15, when the first buffer layer 122 is formed on the substrate 110, first mask layers M1 are formed on the buffer layer 122. The first mask layers M1 may be formed by using PR or SiO2 and may be formed only in some regions of the first buffer layer 122.

Figure 16:
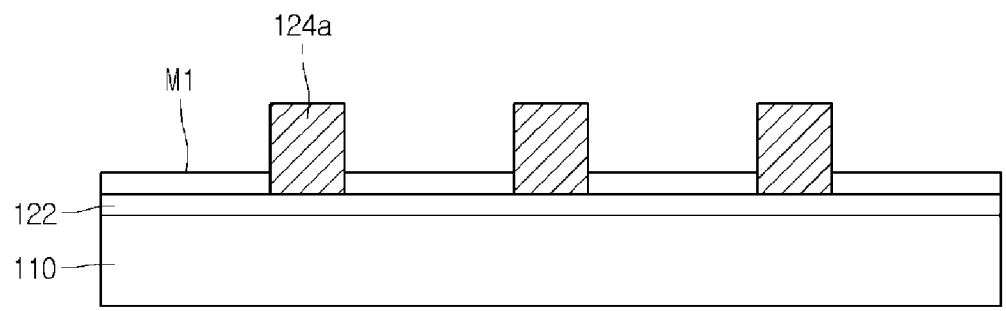

As illustrated in FIG. 16, when the first mask layers M1 are formed on the first buffer layer 122, first layers 124a of a second buffer layer are formed between the first mask layers M1. The first layers 124a may be selectively formed by using AlGaN. The first layers 124a may be formed by increasing an Al composition ratio.

Figure 17:
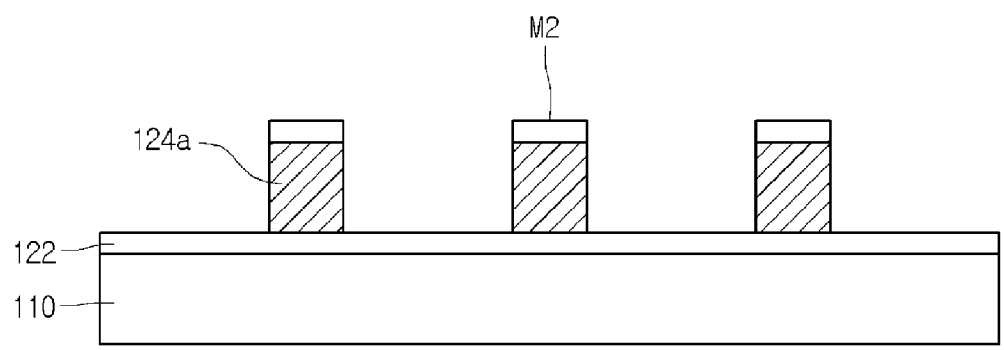

As illustrated in FIG. 17, when the first layers 124a are formed on the first buffer layer 122, second mask layers M2 are formed on the first layers 124a. The second mask layers M2 may be formed by using PR or SiO2.

Figure 18:
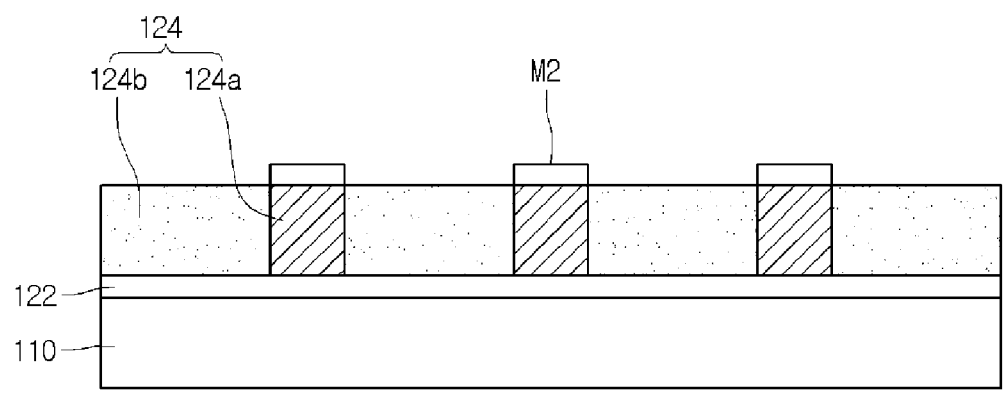

As illustrated in FIG. 18, when the second mask layers M2 are formed on the first layers 124a, second layers 124b are selectively grown between the first layers 124a. The second layers 124b may be selectively formed by using AlGaN. The second layers 124b may be formed by decreasing an Al composition ratio. When the first layers 124a and the second layers 124b are formed, the second mask layers M2 may be removed.

Figure 19:
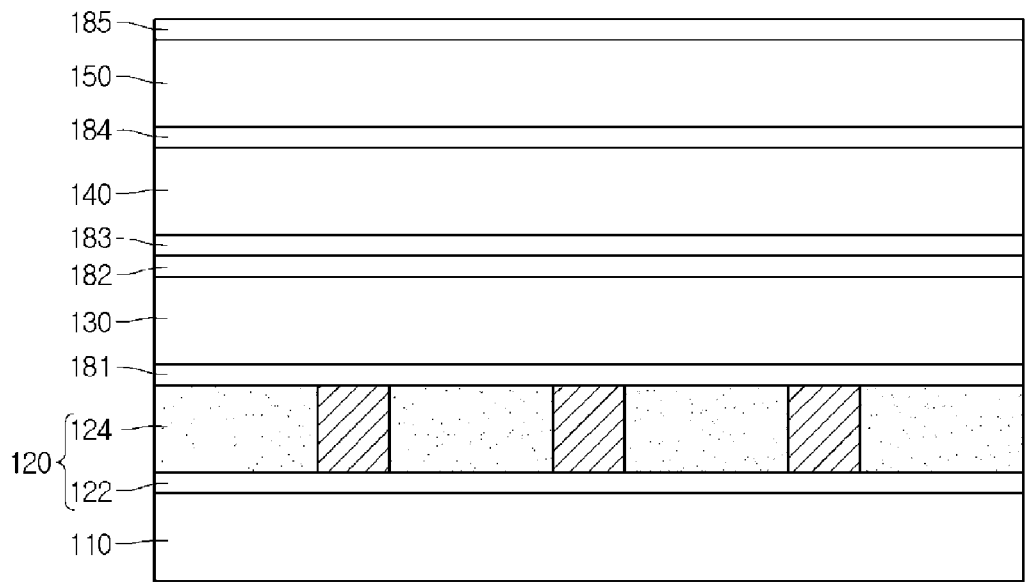

As illustrated in FIG. 19, when the first layers 124a and the second layers 124b of the second buffer layer 124 are formed on the first buffer layer 122, a u-GaN layer 181, a first conductive type semiconductor layer 130, a current diffusion layer 182, a strain control layer 183, an active layer 140, an electron blocking layer 184, a second conductive type semiconductor layer 150, and a transparent electrode layer 185 are sequentially formed on the second buffer layer 124.

The u-GaN layer 181 may be formed by depositing GaN though an MOCVD. The first conductive type semiconductor layer 130 may be formed by depositing GaN though an MOCVD and may also be formed by depositing a group III-V compound or a group II-VI compound. In addition, the first conductive type semiconductor layer 130 may be formed by injecting a silane gas (SiH4) including n-type impurities such as a trimethyl gallium (TMGa) gas, an ammonia (NH3) gas, a nitrogen (N2) gas, and silicon (Si) into a chamber.

The current diffusion layer 182 and the strain control layer 183 may be deposited to have a certain thickness through an MOCVD. The active layer 140 may be grown by forming a well layer made of GaN or InGaN and a barrier layer made of GaN, AlGaN, InGaN, or InAlGaN by selectively supplying H2 and/or TMGa (or TEGa), TMIn, and TMAl as a source at a certain growth temperature in the range of about 700° C. to about 950° C.

The electron blocking layer 184 may be formed by injecting ions. For example, The electron blocking layer 184 may be made of AlxInyGa(1-x-y) having an Al composition ratio of about 1% to about 30%.

The second conductive type semiconductor layer 150 may be formed by injecting bis(ethyl cyclopentadienyl)magnesium [EtCp2Mg=Mg(C2H5C5H4)2] on the electron blocking layer 184, and as a result, may be formed as a p-type GaN layer. The transparent electrode layer 185 may be formed by depositing ITO.

As illustrated in FIG. 20, when the transparent electrode layer 185 is formed on the second conductive type semiconductor layer 150, a mesa etching process may be performed to partially expose the first conductive type semiconductor layer 130. For example, an upper portion of the first conductive type semiconductor layer 130 may be partially exposed by partially removing the transparent electrode layer 185, the second conductive type semiconductor layer 150, the electron blocking layer 184, the active layer 140, the strain control layer 183, and the current diffusion layer 182.

When the upper portion of the first conductive type semiconductor layer 130 is partially exposed, the manufacturing process of the light-emitting device according to the embodiment may be completed by forming a first electrode 160 on the first conductive type semiconductor layer 130 and forming a second electrode 170 on the transparent electrode layer 185.

Figure 21:
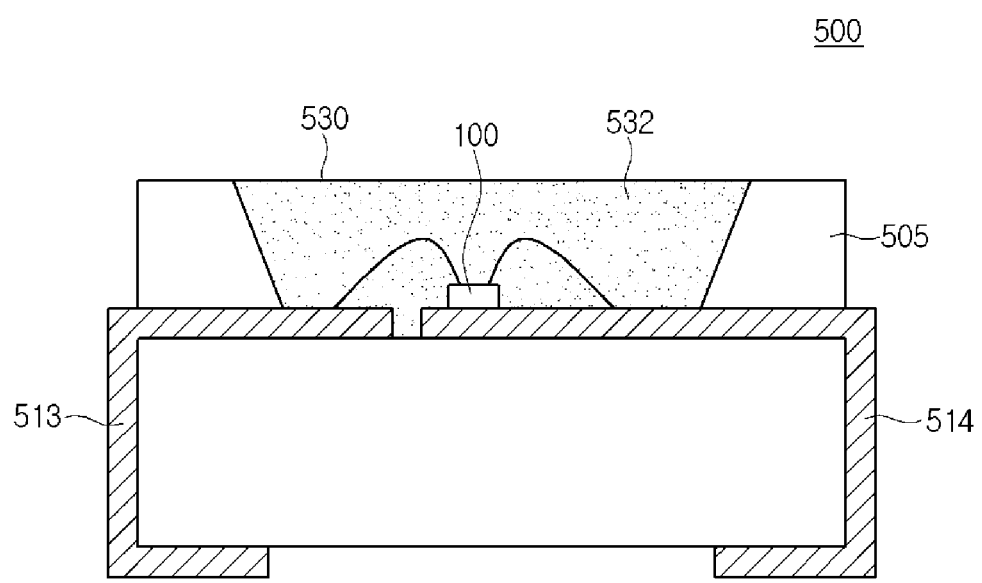
FIG. 21 is a cross-sectional view of a light-emitting device package having a light-emitting device according to embodiments.

FIG. 21 is a cross-sectional view of a light-emitting device package having a light-emitting device according to embodiments.

As illustrated in FIG. 21, a light-emitting device package 500 includes a package body unit 505; a third electrode layer 513 and a fourth electrode layer 514, which are disposed on the package body unit 505; a light-emitting device 100 disposed on the package body unit 505 and electrically connected to the third electrode layer 513 and the fourth electrode layer 514; and a molding member 530 surrounding the light-emitting device 100.

The package body unit 505 may be made of a silicon material, a synthetic resin material, or a metallic material, and may have an inclined surface around the light-emitting device 100.

The third electrode layer 513 and the fourth electrode layer 514 are electrically separated from each other and function to supply power to the light-emitting device 100. In addition, the third electrode layer 513 and the fourth electrode layer 514 may function to reflect light generated by the light-emitting device 100 to thereby improve luminous efficiency, and may function to discharge heat generated by the light-emitting device 100 to the outside.

The light-emitting device 100 may be disposed on the package body unit 505, or may be disposed on the third electrode layer 513 or the fourth electrode layer 514.

The light-emitting device 100 may be electrically connected to the third electrode layer 513 and/or the fourth electrode layer 514 through any one of a wire method, a flip-chip method, and a die bonding method. In the embodiment, the light-emitting device 100 is exemplified as being electrically connected to each of the third electrode layer 513 and the fourth electrode layer 514 through a wire, but the embodiment is not limited thereto.

The molding member 530 may protect the light-emitting device 100 by surrounding the light-emitting device 100. In addition, since the molding member 530 includes a phosphor 532, the molding member 530 may change a wavelength of light emitted by the light-emitting device 100.

Figure 22:
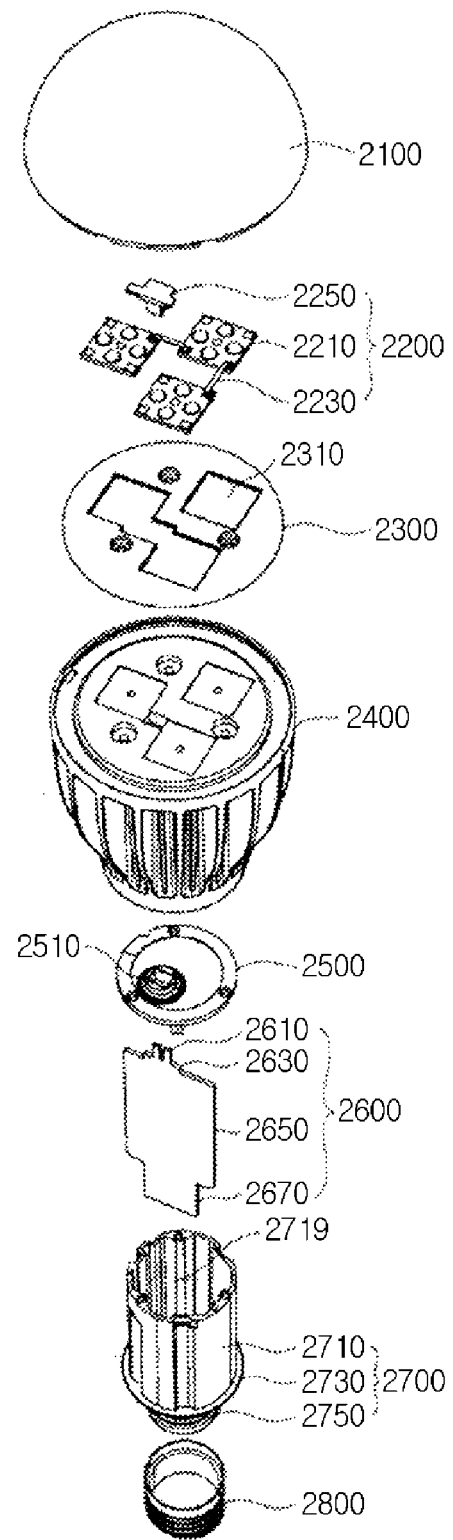
Figure 23:
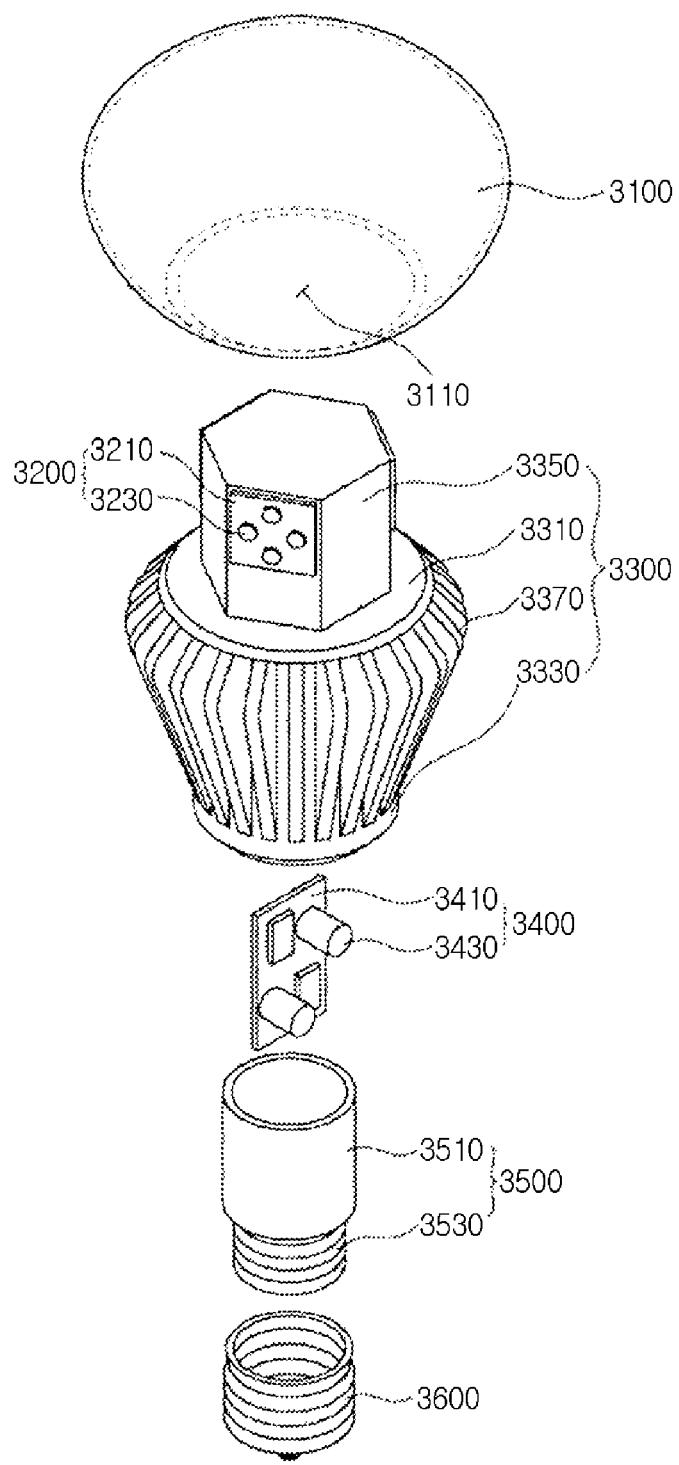

FIGS. 22 to 24 are exploded perspective views of embodiments of lighting systems respectively having the light-emitting devices according to the embodiments.

As illustrated in FIG. 22, a lighting system according to an embodiment may include a cover 2100, a light source module 2200, a radiator 2400, a power supply unit 2600, an inner case 2700, and a socket 2800. In addition, the lighting system according to the embodiment may further include at least one of a member 2300 and a holder 2500. The light source module 2200 may include the light-emitting device 100 or the light-emitting device package 200 according to the present invention.

For example, the cover 2100 may have a bulb shape or a semispherical shape and may be hollow, and a part of the cover 2100 may be opened. The cover 2100 may be optically coupled to the light source module 2200. For example, the cover 2100 may diffuse, scatter, or excite light provided from the light source module 2200. The cover 2100 may be a type of optical member. The cover 2100 may be coupled to the radiator 2400. The cover 2100 may have a coupling portion which is coupled to the radiator 2400.

An inner surface of the cover 2100 may be coated with an ivory white paint. The ivory white paint may include a diffusion material which diffuses light. A surface roughness of the inner surface of the cover 2100 may be greater than a surface roughness of an outer surface of the cover 2100, so as to sufficiently scatter and diffuse the light from the light source module 2200 and discharge the diffused and scattered light to the outside.

A material of the cover 2100 may include glass, plastic, polypropylene (PP), polyethylene (PE), polycarbonate (PC), and the like. The polycarbonate (PC) has superior light resistance, superior heat resistance, and superior strength. The cover 2100 may be transparent so that the light source module 2200 is visible from the outside, or may be opaque. The cover 2100 may be formed through blow molding.

The light source module 2200 may be disposed on one surface of the radiator 2400. Accordingly, heat from the light source module 2200 is transferred to the radiator 2400. The light source module 2200 may include a light source unit 2210, a connection plate 2230, and a connector 2250.

The member 2300 is disposed on the radiator 2400 and includes guide grooves 2310 into which a plurality of light source units 2210 and the connector 2250 are inserted. Each of the guide grooves 2310 corresponds to a substrate of the light source unit 2210 and the connector 2250

A surface of the member 2300 may be applied or coated with a light-reflecting material. The surface of the member 2300 may be applied or coated with a white paint. The member 2300 reflects light, which is reflected by the inner surface of the cover 2100 and is returned toward the light source module 2200, again toward the cover 2100. Accordingly, it is possible to improve the luminous efficiency of the lighting system according to the embodiment.

The member 2300 may be made of, for example, an insulating material. The connection plate 2230 of the light source module 2200 may include an electrically conductive material. Accordingly, the radiator 2400 may electrically contact the connection plate 2230. Since the member 2300 is made of the insulating material, the member 2300 may prevent an electrical short between the connection plate 2230 and the radiator 2400. The radiator 2400 receives heat from the light source module 2200 and the power supply unit 2600 and radiates the received heat.

The holder 2500 covers an accommodation groove 2719 of an insulating portion 2710 in the inner case 2700. Accordingly, the power supply unit 2600, which is accommodated in the insulating portion 2710 of the inner case 2700, is tightly sealed. The holder 2500 has a guide protrusion 2510. The guide protrusion 2510 has a hole through which a protrusion 2610 of the power supply unit 2600 passes.

The power supply unit 2600 processes or converts an electric signal received from the outside and provides the processed or converted electric signal to the light source module 2200. The power supply unit 2600 is accommodated in the accommodation groove 2719 of the inner case 2700 and is sealed inside the inner case 2700 by the holder 2500.

The power supply unit 2600 may include a protrusion 2610, a guide portion 2630, a base 2650, and an extension portion 2670.

The guide portion 2630 has a shape protruding outward from one side of the base 2650. The guide portion 2630 may be inserted into the holder 2500. A plurality of components may be disposed on one surface of the base 2650. The plurality of components may include, for example, a DC converter which converts AC power supplied from an external power supply into DC power, a driving chip which controls driving of the light source module 2200, and an electrostatic discharge (ESD) protection device which protects the light source module 2200, but are not limited thereto.

The extension portion 2670 has a shape protruding outward from another side of the base 2650. The extension portion 2670 is inserted into the connection portion 2750 of the inner case 2700 and receives an electric signal from the outside. For example, a width of the extension portion 2670 may be equal to or less than a width of the connection portion 2750 of the inner case 2700. One end of a positive (+) wire and one end of a negative (−) wire may be electrically connected to the extension portion 2670, and the other end of the positive (+) wire and the other end of the negative (−) wire may be electrically connected to the socket 2800.

The inner case 2700 may include a molding portion therein together with the power supply unit 2600. The molding portion may be formed by hardening a molding liquid and may fix the power supply unit 2600 to the inside of the inner case 2700.

As illustrated in FIG. 23, a lighting system according to an embodiment may include a cover 3100, a light source unit 3200, a radiator 3300, a circuit unit 3400, an inner case 3500, and a socket 3600. The light source unit 3200 may include the light-emitting device or the light-emitting device package according to the embodiment.

The cover 3100 may have a bulb shape and be hollow. The cover 3100 has an opening 3110. The light source unit 3200 and a member 3350 may be inserted through the opening 3110.

The cover 3100 may be coupled to the radiator 3300 and surround the light source unit 3200 and the member 3350. The light source unit 3200 and the member 3350 may be blocked from the outside due to the coupling between the cover 3100 and the radiator 3300. The cover 3100 may be coupled to the radiator 3300 through an adhesive or various methods such as a rotation coupling method and a hook coupling method. The rotation coupling method is a method in which a thread of the cover 3100 is coupled to a thread groove of the radiator 3300, and the cover 3100 is coupled to the radiator 3300 by the rotation of the cover 3100. The hook coupling method is a method in which a projection of the cover 3100 is inserted into a groove of the radiator 3300 so that the cover 3100 is coupled to the radiator 3300.

The cover 3100 may be optically coupled to the light source unit 3200. Specifically, the cover 3100 may diffuse, scatter, or excite light from the light source unit 3200. The cover 3100 may be a type of optical member. The cover 3100 may have a phosphor in an inner/outer surface or an inside thereof so as to excite the light from the light source unit 3200.

An inner surface of the cover 3100 may be coated with an ivory white paint. The ivory white paint may include a diffusion material which diffuses light. A surface roughness of the inner surface of the cover 3100 may be greater than a surface roughness of an outer surface of the cover 3100, so as to sufficiently scatter and diffuse the light from the light source unit 3200.

A material of the cover 3100 may include glass, plastic, polypropylene (PP), polyethylene (PE), polycarbonate (PC), and the like. The polycarbonate (PC) has superior light resistance, superior heat resistance, and superior strength. The cover 3100 may be made of a transparent material through which the light source unit 3200 and the member 3350 are visible from the outside or may be made of an opaque material through which the light source unit 3200 and the member 3350 are not visible from the outside. The cover 3100 may be formed through, for example, blow molding.

The light source unit 3200 may be disposed on the member 3350 of the radiator 3300 and may be disposed in plurality. Specifically, the light source unit 3200 may be disposed on at least one of a plurality of side surfaces in the member 3350. The light source unit 3200 may be disposed on an upper portion of at least one side surface in the member 3350.

The plurality of light source unit 3200 may be respectively disposed on three of six side surfaces in the member 3350. However, the embodiment is not limited thereto, and the plurality of light source units 3200 may be respectively disposed on all of the six surfaces in the member 3350. The light source unit 3200 may include a substrate 3210 and a light-emitting device 3230. The light-emitting device 3230 may be disposed on one surface of the substrate 3210.

The substrate 3210 may have a tetragonal plate shape, but is not limited thereto. The substrate 3210 may have various shapes. For example, the substrate 3210 may have a circular plate shape or a polygonal plate shape. The substrate 3210 may be provided by printing circuit patterns on an insulator, and for example, include a general printed circuit board (PCB), a metal core PCB, a flexible PCB, a ceramic PCB, and the like. In addition, the substrate 3210 may include a chips on board (COB) type in which unpackaged LED chips are directly bonded on the general PCB. Furthermore, the substrate 3210 may be made of a material which effectively reflects light, or a surface of the substrate 3210 may have a color, such as a white color or a silver color, which effectively reflects light. The substrate 3210 may be electrically connected to the circuit unit 3400 accommodated in the radiator 3300. The substrate 3210 and the circuit unit 3400 may be connected to each other through, for example, a wire. The wire may connect the substrate 3210 and the circuit unit 3400 to each other through the radiator 3300.

The light-emitting device 3230 may include a light-emitting diode chip emitting red light, green light, and blue light or a light-emitting diode chip emitting UV. The light-emitting diode chip may be a lateral type or a vertical type. The light-emitting diode may emit blue light, red light, yellow light, green light.

The light-emitting device 3230 may have a phosphor. The phosphor may include at least one of a garnet-based phosphor (YAG or TAG), a silicate-based phosphor, a nitride-based phosphor, and an oxynitride-based phosphor. Alternatively, the phosphor may include at least one of a yellow phosphor, a green phosphor, and a red phosphor.

The radiator 3300 may be coupled to the cover 3100 and radiate heat from the light source unit 3200. The radiator 3300 has a certain volume and has a top surface 3310 and a side surface 3330. The member 3350 may be disposed on the top surface 3310 of the radiator 3300. The top surface 3310 of the radiator 3300 may be coupled to the cover 3100. The top surface 3310 of the radiator 3300 may have a shape corresponding to the opening 3110 of the cover 3100.

A plurality of heat radiation pins 3370 may be disposed on the side surface 3330 of the radiator 3300. The heat radiation pins 3370 may extend outward from the side surface 3330 of the radiator 3300 or may be connected to the side surface 3330 of the radiator 3300. The heat radiation pins 3370 may improve heat radiation efficiency by increasing a heat radiation area of the radiator 3300. The side surface 3330 may not include the heat radiation pins 3370.

The member 3350 may be disposed on the top surface 3310 of the radiator 3300. The member 3350 may be integrated with or coupled to the top surface 3310 of the radiator 3300. The member 3350 may have a polygonal prism shape. Specifically, the member 3350 may have a hexagonal prism shape. The member 3350 having the polygonal prism shape has a top surface, a bottom surface, and six side surfaces. The member 3350 may have a circular prism shape or an elliptical prism shape as well as the hexagonal prism shape. When the member 3350 has the circular prism shape or the elliptical prism shape, the substrate 3210 of light source unit 3200 may be a flexible substrate.

The plurality of light source units 3200 may be respectively disposed on the six side surfaces of the member 3350. The plurality of light source units 3200 may be disposed on all or some of the six side surfaces in the member 3350. The plurality of light source units 3200 are illustrated in FIG. 23 as being respectively disposed on three of the six side surfaces.

The substrate 3210 is disposed on the side surface of the member 3350. The side surface of the member 3350 may be substantially perpendicular to the top surface 3310 of the radiator 3300. Therefore, the substrate 3210 and the top surface 3310 of the radiator 3300 may be substantially perpendicular to each other.

A material of the member 3350 may include a material having thermal conductivity so as to ensure that the member 3350 rapidly receives heat generated from the light source unit 3200. The material of the member 3350 may include, for example, an alloy of metals such as aluminum (Al), nickel (Ni), copper (Cu), magnesium (Mg), silver (Ag), and tin (Sn). Alternatively, the member 3350 may be made of plastic having thermal conductivity. The plastic having the thermal conductivity is lighter than a metal and has thermal conductivity in a single direction.

The circuit unit 3400 receives power from the outside, and converts the received power into power suitable for the light source unit 3200. The circuit unit 3400 provides the converted power to the light source unit 3200. The circuit unit 3400 may be disposed in the radiator 3300. Specifically, the circuit unit 3400 may be accommodated in the inner case 3500 and be accommodated in the radiator 3300 together with the inner case 3500. The circuit unit 3400 may include a circuit board 3410 and a plurality of components 3430 mounted on the circuit board 3410.

The circuit board 3410 may have a circular plate shape, but is not limited thereto. The circuit board 3410 may have various shapes. For example, the circuit board 3410 may have an elliptical plate shape or a polygonal plate shape. The circuit board 3410 may be provided by printing circuit patterns on an insulator.

The circuit board 3410 is electrically connected to the substrate 3210 of the light source unit 3200. The circuit board 3410 and the substrate 3210 may be electrically connected to each other through, for example, a wire. The wire may be disposed inside the radiator 3300 to connect the circuit board 3410 and the substrate 3210.

The plurality of components 3430 may include, for example, a DC converter which converts AC power supplied from an external power supply into DC power, a driving chip which controls driving of the light source unit 3200, and an electrostatic discharge (ESD) protection device which protects the light source unit 3200.

The inner case 3500 accommodates the circuit unit 3400 therein. The inner case 3500 may have an accommodation portion 3510 so as to accommodate the circuit unit 3400.

For example, the accommodation portion 3510 may have a cylindrical shape. A shape of the accommodation portion 3510 may be changed according to a shape of the radiator 3300. The inner case 3500 may be accommodated in the radiator 3300. The accommodation portion 3510 of the inner case 3500 may be accommodated in an accommodation portion formed in a lower surface of the radiator 3300.

The inner case 3500 may be coupled to the socket 3600. The inner case 3500 may have a connection portion 3530 coupled to the socket 3600. The connection portion 3530 may have a thread structure corresponding to a thread groove structure of the socket 3600. The inner case 3500 is an insulator. Accordingly, the inner case 3500 prevents an electrical short between the circuit unit 3400 and the radiator 3300. For example, the inner case 3500 may be made of a plastic material or a resin material.

The socket 3600 may be coupled to the inner case 3500. Specifically, the socket 3600 may be coupled to the connection portion 3530 of the inner case 3500. The socket 3600 may have the same structure as an existing incandescent light bulb. The socket 3600 is electrically connected to the circuit unit 3400. The circuit unit 3400 and the socket 3600 may be electrically connected to each other through a wire. Therefore, when external power is applied to the socket 3600, the external power may be transferred to the circuit unit 3400. The socket 3600 may have a thread groove structure corresponding to a thread structure of the connection portion 3550.

As illustrated in FIG. 24, a lighting system, for example, a backlight unit may include a light guide plate 1210, a light-emitting module 1240 which provides light to the light guide plate 1210, a reflective member 1220 below the light guide plate 1210, and a bottom cover 1230 which accommodates the light guide plate 1210, the light-emitting module 1240, and the reflective member 1220, but is not limited thereto.

The light guide plate 1210 functions to diffuse light and convert the light into a surface light source. The light guide plate 1210 may be made of a transparent material. For example, the light guide plate 1210 may include at least one selected from an acryl-based resin such as polymethyl methacrylate (PMMA), polyethylene terephthalate (PET), polycarbonate (PC), a cycloolefin copolymer (COC), and a polyethylene naphthalate (PEN) resin.

The light-emitting module 1240 provides light to at least one side surface of the light guide plate 1210 and eventually serves as a light source of a display device in which the backlight unit is disposed.

The light-emitting module 1240 may contact the light guide plate 1210, but the embodiment is not limited thereto. Specifically, the light-emitting module 1240 may include a substrate 1242 and a plurality of light-emitting device packages 200 mounted on the substrate 1242, and the substrate 1242 may contact the light guide plate 1210, but the embodiment is not limited thereto.

The substrate 1242 may include a printed circuit board (PCB) having circuit patterns (not illustrated). In addition, the substrate 1242 may also include a metal core PCB (MCPCB) or a flexible PCB (FPCB) as well as a general PCB, but the embodiment is not limited thereto.

The plurality of light-emitting device packages 200 may be mounted on the substrate 1242 such that light emission surfaces of the light-emitting device packages 200 are spaced apart from the light guide plate 1210 by a certain distance, light being emitted thorough the light emission surfaces.

The reflective member 1220 may be disposed below the light guide plate 1210. The reflective member 1220 may improve the brightness of the backlight unit by reflecting light traveling downward through a lower surface of the light guide plate 1210 and allowing the reflected light to travel upward. The reflective member 1220 may be made of, for example, a PET resin, a PC resin, a PVC resin, or the like, but the embodiment is not limited thereto.

The bottom cover 1230 may accommodate the light guide plate 1210, the light-emitting module 1240, and the reflective member 1220. To this end, the bottom cover 1230 may be formed to have a box shape with an open top surface, but the embodiment is not limited thereto.

The bottom cover 1230 may be manufactured through press molding or extrusion molding by using a metallic material or a resin material.

Although embodiments have been particularly shown and described, they are only for illustrative purposes and are not intended to the present invention. It will be understood that various modifications and applications can be made thereto without departing from the scope of the present invention by those skilled in the art to which the embodiments pertain. For example, the elements particularly shown in the embodiments can be carried out through modifications. It will be understood that differences related to these modifications and applications fall within the scope of the embodiments defined by the appended claims.

The invention claimed is:
1. A light-emitting device comprising:
a substrate;
a first buffer layer disposed on the substrate;
a second buffer layer disposed on the first buffer layer and including Al;
a first conductive type semiconductor layer disposed on the second buffer layer;
an active layer disposed on the first conductive type semiconductor layer; and
a second conductive type semiconductor layer disposed on the active layer,
wherein the second buffer layer comprises one or more first layers and one or more second layers which are horizontally disposed, and
an Al composition ratio of the first layer increases toward the first conductive type semiconductor layer, and an Al composition ratio of the second layer decreases toward the first conductive type semiconductor layer.

2. The light-emitting device of claim 1, wherein the Al composition ratio of the first layer linearly increases toward the first conductive type semiconductor layer, and the Al composition ratio of the second layer linearly decreases toward the first conductive type semiconductor layer.

3. The light-emitting device of claim 1, wherein the Al composition ratio of the first layer nonlinearly increases toward the first conductive type semiconductor layer, and the Al composition ratio of the second layer nonlinearly decreases toward the first conductive type semiconductor layer.

4. The light-emitting device of claim 3, wherein the Al composition ratio of the first layer nonlinearly increases in a downward convex form, and the Al composition ratio of the second layer nonlinearly decreases in an upward convex form.

5. The light-emitting device of claim 3, wherein the Al composition ratio of the first layer nonlinearly increases in an upward convex form, and the Al composition ratio of the second layer nonlinearly decreases in a downward convex form.

6. The light-emitting device of claim 1, wherein the Al composition ratio of the first layer increases toward the first conductive type semiconductor layer in a stepped form, and the Al composition ratio of the second layer decreases toward the first conductive type semiconductor layer in a stepped form.

7. The light-emitting device of claim 6, wherein the light-emitting device has a region in which the Al composition ratio increases and a region in which the Al composition ratio is constant.

8. The light-emitting device of claim 1, wherein a width of the second layer is greater than a width of the first layer.

9. The light-emitting device of claim 8, wherein a height of the first layer is equal to a height of the second layer.

10. The light-emitting device of claim 9, wherein a side surface of the first layer is perpendicular to a top surface of the first buffer layer.

11. The light-emitting device of claim 10, wherein a u-GaN layer is further disposed on the second buffer layer, and upper surfaces of the first layer and the second layer contact the u-GaN layer.

12. The light-emitting device of claim 1, wherein the first layers and the second layers are alternately disposed.

13. The light-emitting device of claim 12, wherein the second layer is disposed at an outmost portion of the second buffer layer.

14. The light-emitting device of claim 13, wherein the number of the second layers is greater than the number of the first layers.

15. The light-emitting device of claim 1, wherein a width of the first layer is different from a width of the second layer.

16. The light-emitting device of claim 1, wherein the first buffer layer includes AlN, and the second buffer layer includes AlGaN.

17. The light-emitting device of claim 1, wherein a u-GaN layer is further disposed on the second buffer layer.

* * * * *